United States Patent
Tsuura et al.

(10) Patent No.: US 12,421,435 B2
(45) Date of Patent: Sep. 23, 2025

(54) ADHESIVE COMPOSITION FOR FLEXIBLE PRINTED-WIRING BOARD (FPC), AND HEAT-CURABLE RESIN FILM, PREPREG AND FPC SUBSTRATE CONTAINING SAME

(71) Applicant: Shin-Etsu Chemical Co., Ltd., Tokyo (JP)

(72) Inventors: Atsushi Tsuura, Annaka (JP); Yoshihiro Tsutsumi, Annaka (JP); Hiroyuki Iguchi, Annaka (JP); Yuki Kudo, Annaka (JP); Masayuki Iwasaki, Annaka (JP); Rina Sasahara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 192 days.

(21) Appl. No.: 17/696,172

(22) Filed: Mar. 16, 2022

(65) Prior Publication Data
US 2022/0306920 A1 Sep. 29, 2022

(30) Foreign Application Priority Data
Mar. 25, 2021 (JP) .................. 2021-051812

(51) Int. Cl.
| | |
|---|---|
| C09J 179/08 | (2006.01) |
| C08K 3/36 | (2006.01) |
| C08K 5/3445 | (2006.01) |
| C08K 5/3492 | (2006.01) |
| C08K 9/06 | (2006.01) |
| C09J 7/35 | (2018.01) |
| H05K 1/03 | (2006.01) |

(52) U.S. Cl.
CPC .............. *C09J 179/08* (2013.01); *C08K 3/36* (2013.01); *C08K 5/3445* (2013.01); *C08K 5/3492* (2013.01); *C08K 9/06* (2013.01); *C09J 7/35* (2018.01); *H05K 1/0373* (2013.01); *C09J 2203/326* (2013.01); *C09J 2301/304* (2020.08)

(58) Field of Classification Search
CPC ...... C09J 7/35; C09J 2301/304; C09J 179/08; C08L 63/00; C08L 79/08; C08K 5/3445; C08K 5/3492
USPC .......................................... 428/901
See application file for complete search history.

(56) References Cited

U.S. PATENT DOCUMENTS

| | | | |
|---|---|---|---|
| 10,822,527 | B2 | 11/2020 | Tochihira et al. |
| 2018/0002485 | A1* | 1/2018 | Tanigawa ............... B32B 27/34 |
| 2018/0237668 | A1* | 8/2018 | Mizori ................ C08G 59/686 |
| 2021/0024749 | A1* | 1/2021 | Osada ...................... C08K 3/22 |
| 2023/0064310 | A1* | 3/2023 | Watanabe ............... C08L 61/06 |

FOREIGN PATENT DOCUMENTS

| | | |
|---|---|---|
| JP | 2019-112642 A | 7/2019 |
| JP | 2020-56011 A | 4/2020 |
| KR | 102090193 B1 * | 3/2020 |

OTHER PUBLICATIONS

Translation of KR102090193B1 (Year: 2025).*

* cited by examiner

*Primary Examiner* — Tri V Nguyen
(74) *Attorney, Agent, or Firm* — Birch, Stewart, Kolasch & Birch, LLP

(57) ABSTRACT

Provided is an adhesive composition for a flexible printed-wiring board (FPC) that has low dielectric properties, a high adhesion strength to low-dielectric resin films (LCP or MPI) and a copper foil, and an excellent moisture resistance and reflow resistance. This adhesive composition contains:
(A) 100 parts by mass of a maleimide compound having at least two maleimide groups in one molecule, having a number average molecular weight of greater than 4,000, and having at least one divalent organic group selected from a dimer acid skeleton, a linear alkylene group having not less than 6 carbon atoms, and a linear alkenylene group having not less than 6 carbon atoms;
(B) 0.1 to 15 parts by mass of an epoxy resin having at least two epoxy groups in one molecule; and
(C) 0.1 to 5 parts by mass of a diaminotriazine ring-containing imidazole.

14 Claims, No Drawings

ADHESIVE COMPOSITION FOR FLEXIBLE PRINTED-WIRING BOARD (FPC), AND HEAT-CURABLE RESIN FILM, PREPREG AND FPC SUBSTRATE CONTAINING SAME

BACKGROUND OF THE INVENTION

Field of the Invention

The present invention relates to an adhesive composition for a flexible printed-wiring board (FPC); and a heat-curable resin film, prepreg and FPC substrate containing such composition.

Background Art

In recent years, as electronic devices have become smaller and more sophisticated, it is now required that wirings on a multilayered printed-wiring board be formed finer and at a higher density. In this regard, there is now a higher demand for a flexible printed-wiring board (FPC: Flexible Printed Circuits) that is thin and light-weight, and has a flexibility and a high durability. In general, an FPC has a structure where a circuit pattern is formed on a copper foil laminated on a heat-resistant and insulating film (base material) such as a polyimide film which is a typical example thereof, and this circuit pattern is filled with a heat-curable resin and is further covered by another heat-resistant film. In addition, materials intended for high frequencies are required in the next generation, and a low transmission loss is critical as a countermeasure for noises; it is required that there be used an insulating material superior in dielectric properties.

While polyimide that has been used as a base material has a high heat resistance and an excellent insulation property, it does not exhibit low dielectric properties. As base materials with low dielectric properties, attentions are now drawn to liquid crystal polymer films (LCP: Liquid Crystal Polymer films) and modified polyimide films (MPI: Modified Polyimide films). It has been suggested that these materials be used as base materials in FPC substrates as they exhibit dielectric properties superior to those of conventional polyimide films.

Meanwhile, an FPC usually requires an adhesive agent for bonding a copper foil to a base material; as described above, this adhesive agent is also required to possess excellent dielectric properties. As such adhesive agent, there are known epoxy resin compositions and acrylic resin compositions; however, there is a concern that a larger transmission loss may be observed with the use of these materials, since they have high dielectric properties. Thus, even an adhesive agent for FPC is required to have even lower dielectric properties.

As a low-dielectric material, there has been proposed a resin composition using polyphenylene ether. However, while this resin composition is superior in heat resistance, it is inferior in adhesiveness.

Here, as prior arts pertaining to the present invention, there can be listed those disclosed in JP-A-2020-056011 and JP-A-2019-112642.

SUMMARY OF THE INVENTION

In terms of a next-generation material intended for high frequencies, as is the case with a base material itself, an adhesive agent is also required to possess low dielectric properties in addition to an adhesion strength to the base material and a copper foil, and further possess a reflow resistance and a moisture resistance; none of the currently available adhesive agents possesses all these properties in a combined manner.

Thus, it is an object of the present invention to provide an adhesive composition for FPC that has low dielectric properties, a high adhesion strength to low-dielectric resin films (LCP, MPI) and a copper foil, and an excellent moisture resistance and reflow resistance.

The inventors of the present invention diligently conducted a series of studies to solve the aforementioned problems, and completed the invention as follows. That is, the inventors found that the following composition was able to achieve the above object.

[1]
An adhesive composition for a flexible printed-wiring board (FPC: Flexible Printed Circuits), comprising:
(A) 100 parts by mass of a maleimide compound having at least two maleimide groups in one molecule, having a number average molecular weight of greater than 4,000, and having at least one divalent organic group selected from a dimer acid skeleton, a linear alkylene group having not less than 6 carbon atoms, and a linear alkenylene group having not less than 6 carbon atoms, the maleimide compound being represented by the following general formula (1),

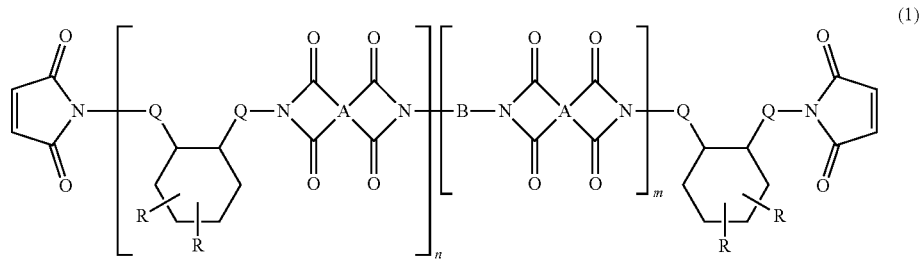

wherein A independently represents a tetravalent organic group having an aromatic ring or aliphatic ring, B represents an alkylene group that has 6 to 18 carbon atoms and an aliphatic ring that may contain a hetero atom, Q independently represents a linear alkylene or linear alkenylene group having not less than 6 carbon atoms, R independently represents a linear or branched alkyl group having not less than 6 carbon atoms, n represents a number of 1 to 100, m represents a number of 0 to 100;

(B) 0.1 to 15 parts by mass of an epoxy resin having at least two epoxy groups in one molecule; and
(C) 0.1 to 5 parts by mass of a diaminotriazine ring-containing imidazole.

[2]

The adhesive composition for FPC according to [1], wherein A in the formula (1) is represented by any one of the following structures,

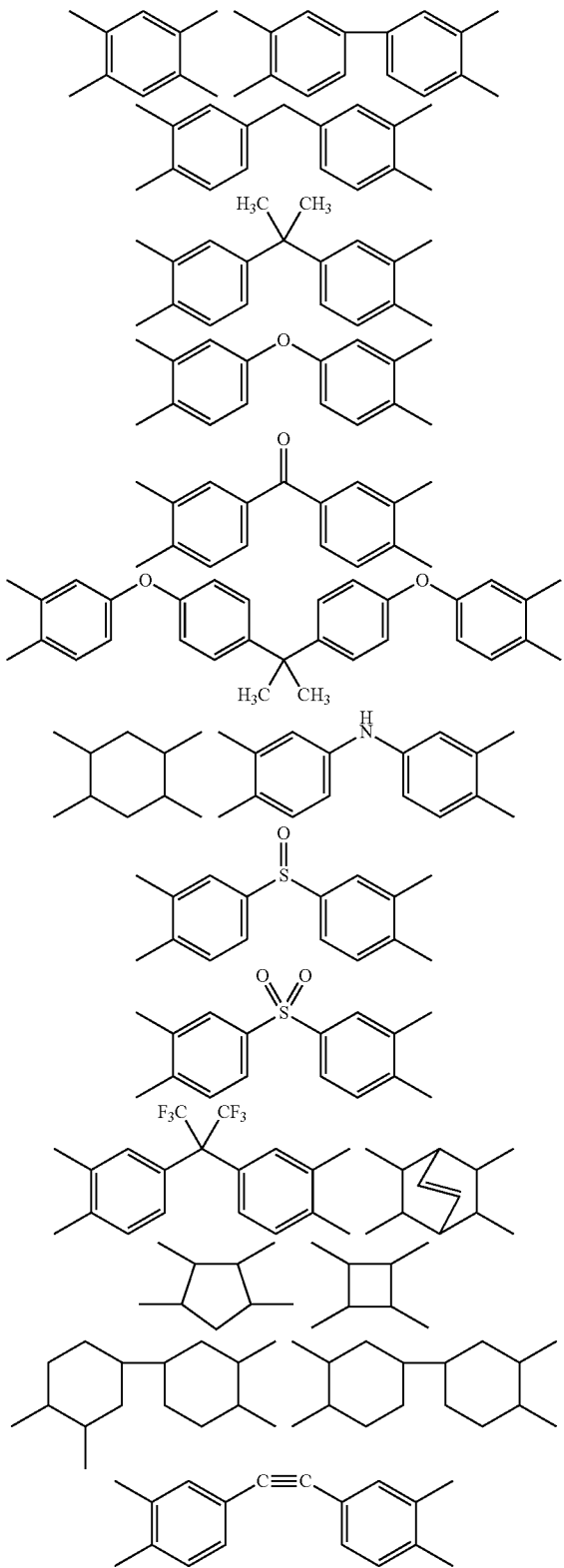

wherein bonds in the above structural formulae that are yet unbonded to substituent groups are to be bonded to carbonyl carbons forming maleimide structures in the formula (1).

[3]

The adhesive composition for FPC according to [1] or [2], further comprising:

(D) an inorganic filler.

[4]

The adhesive composition for FPC according to [3], wherein the inorganic filler as the component (D) is such an inorganic filler that has been treated with a silane coupling agent having organic groups capable of reacting with the component (A).

[5]

The adhesive composition for FPC according to any one of [1] to [4], wherein in the case of a cured product obtained by performing heating at 180° C. for two hours, a dielectric tangent measured at 10 GHz under 25° C. is not larger than 0.0040.

[6]

A heat-curable resin film comprising the adhesive composition for FPC according to any one of [1] to [5].

[7]

A prepreg comprising a semi-cured product of the adhesive composition for FPC according to any one of [1] to [5].

[8]

An FPC substrate comprising a cured product of the adhesive composition for FPC according to any one of [1] to [5].

The adhesive composition for FPC of the present invention has low dielectric properties; a high adhesion strength to a copper foil and a low-dielectric resin film (LCP, MPI) as a base material; and an excellent film-forming property, moisture resistance and reflow resistance. Thus, the composition of the present invention is useful in a film, prepreg, laminate and FPC substrate.

DETAILED DESCRIPTION OF THE INVENTION

The present invention is described in greater detail hereunder.

(A) Maleimide Compound Having at Least Two Maleimide Groups in One Molecule

A component (A) used in the present invention is a maleimide compound having at least two maleimide groups in one molecule, having a number average molecular weight of greater than 4,000, and having at least one divalent organic group selected from a dimer acid skeleton, a linear alkylene group having not less than 6 carbon atoms, and a linear alkenylene group having not less than 6 carbon atoms.

The component (A) is a resin serving as a base of the adhesive composition of the present invention, and imparts superior dielectric properties and a superior adhesion strength if the composition is used as an adhesive agent. Further, since the maleimide compound as the component (A) has at least one divalent organic group selected from a dimer acid skeleton, a linear alkylene group having not less than 6 carbon atoms, and a linear alkenylene group having not less than 6 carbon atoms, the elasticity of an uncured product and cured product of a composition containing such compound can be lowered, and a flexibility can thus be imparted to the cured and uncured resin composition. In general, since a flexibility-imparting agent for a resin composition is inferior in heat resistance, the component (A) as a resin capable of imparting flexibility by itself is also effective in solving this problem as having a maleimide skeleton superior in heat resistance.

The maleimide compound as the component (A) is represented by the following formula (1).

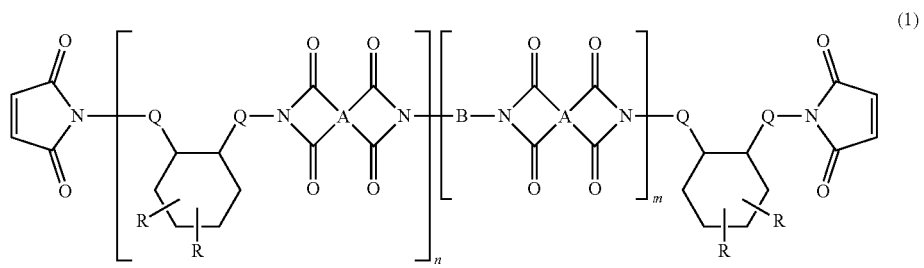

In the formula (1), A independently represents a tetravalent organic group having an aromatic ring or aliphatic ring. B represents an alkylene group that has 6 to 18 carbon atoms and an aliphatic ring that may contain a hetero atom. Q independently represents a linear alkylene or linear alkenylene group having not less than 6 carbon atoms. R independently represents a linear or branched alkyl group having not less than 6 carbon atoms. n represents a number of 1 to 100. m represents a number of 0 to 100.

Q in the formula (1) is a linear alkylene group or a linear alkenylene group each having not less than 6, preferably 6 to 20, more preferably 7 to 15 carbon atoms.

As Q in the formula (1), there may be listed linear alkylene groups such as an n-hexylene group, n-heptylene group, n-octylene group, n-nonylene group and n-decamethylene group; and linear alkenylene groups such as a hexenylene group, a heptenylene group and an octenylene group.

Further, R in the formula (1) is an alkyl group, and may be either a linear alkyl group or a branched alkyl group each having not less than 6, preferably 6 to 12 carbon atoms.
As R in the formula (1), there may be listed, for example, a hexyl group, a heptyl group, an octyl group, a nonyl group, a decyl group, an undecyl group, a lauryl group, a stearyl group, an isohexyl group, an isooctyl group and structural isomers of these groups.

If the maleimide compound as the component (A) has a dimer acid skeleton, the cyclohexane ring structure in the general formula (1) that has two Qs and two Rs may be present as part of a structure derived from a dimer acid. Here, a dimer acid is a liquid dibasic acid whose main component is a dicarboxylic acid and whose carbon number is 36, the dibasic acid being generated by a dimerization of an unsaturated fatty acid whose raw material is a natural substance such as a vegetable fat and oil and whose carbon number is 18. Thus, a dimer acid skeleton is not a single skeleton, but has multiple types of structures, and there exist several types of isomers.

A in the formula (1) represents a tetravalent organic group having an aromatic ring or aliphatic ring; particularly, it is preferred that A be any one of the tetravalent organic groups represented by the following structural formulae,

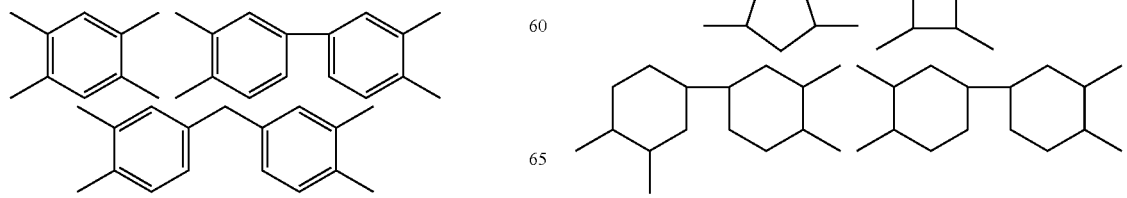

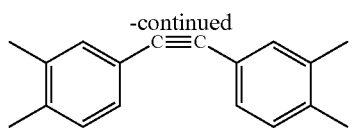

wherein bonds in the above structural formulae that are yet unbonded to substituent groups are to be bonded to carbonyl carbons forming maleimide structures in the formula (1).

Further, B in the formula (1) represents an alkylene group that has 6 to 18 carbon atoms and an aliphatic ring that may contain a hetero atom; it is preferred that this alkylene group has 8 to 15 carbon atoms. It is preferred that B in the formula (1) be any one of the aliphatic ring-containing alkylene groups represented by the following structural formulae,

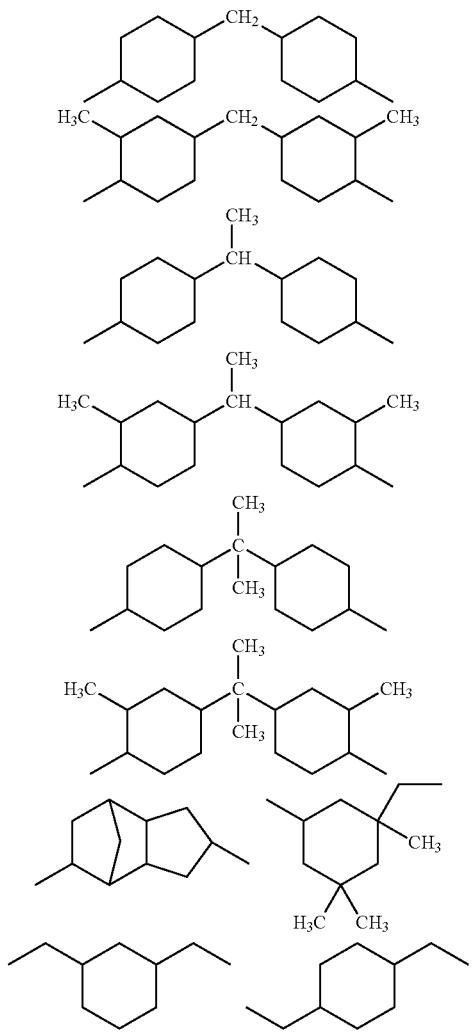

wherein bonds in the above structural formulae that are yet unbonded to substituent groups are to be bonded to nitrogen atoms forming maleimide structures in the formula (4).

In in the formula (1) is a number of 1 to 100, preferably a number of 2 to 70. Further, m in the formula (1) is a number of 0 to 100, preferably a number of 0 to 70.

The number average molecular weight (Mn) of the maleimide compound as the component (A) is a number average molecular weight in terms of polystyrene that is measured by gel permeation chromatography (GPC); this number average molecular weight is greater than 4,000, preferably greater than 4,000 but not greater than 50,000, more preferably 4,500 to 40,000. When such molecular weight is greater than 4,000, the composition can be easily turned into a film. It is preferable if such molecular weight is not greater than 50,000, because the composition obtained will have an appropriate viscosity and fluidity so that a favorable moldability can be achieved when performing laminate molding or the like.

Here, the number average molecular weight (Mn) mentioned in the present invention refers to a number average molecular weight measured by GPC under the following conditions, with polystyrene being used as a reference material.

Measurement Condition
  Developing solvent: Tetrahydrofuran
  Flow rate: 0.35 mL/min
  Detector: RI
  Column: TSK-GEL H type (by TOSOH CORPORATION)
  Column temperature: 40° C.
  Sample injection volume: 5 μL As the maleimide compound as the component (A), there may be used those produced by reacting a corresponding acid anhydride with diamine via a common procedure, and then blocking terminals with maleic anhydride; or those that are commercially available. Examples of the commercially available products in such case include BMI-2500, BMI-3000 and BMI-5000 (all by Designer Molecules Inc.); as well as SLK-2500, SLK-2600 and SLK-3000 (all by Shin-Etsu Chemical Co., Ltd.).

Further, one kind of the maleimide compound as the component (A) may be used alone, or two or more kinds thereof may be used in combination.

(B) Epoxy Resin Having at Least Two Epoxy Groups in One Molecule

A component (B) used in the present invention is an epoxy resin having at least two epoxy groups in one molecule, and is capable of improving an adhesion strength to a copper foil and low-dielectric resin films such as LCP and MPI films. There are no particular restrictions on the component (B) as long as it is an epoxy resin having at least two epoxy groups in one molecule, examples of which may include a phenol novolac type epoxy resin, a bisphenol A type epoxy resin, a bisphenol F type epoxy resin, a biphenol type epoxy resin, a naphthalene type epoxy resin, an anthracene type epoxy resin, a naphthol type epoxy resin, a xylylene type epoxy resin, a biphenyl type epoxy resin, a biphenyl aralkyl type epoxy resin, a triphenylmethane type epoxy resin, a glycidylamine type epoxy resin, a dicyclopentadiene type epoxy resin, a stilbene type epoxy resin, a sulfur atom-containing epoxy resin and a phosphorus atom-containing epoxy resin.

In terms of curability and dielectric properties of a cured product, the component (B) is added in an amount of 0.1 to 15 parts by mass, preferably 0.2 to 13 parts by mass, more preferably 0.5 to 10 parts by mass, per 100 parts by mass of the component (A). It is not preferable if the component (B) is added in an amount of smaller than 0.1 parts by mass per 100 parts by mass of the component (A), because the curability of the composition and the adhesion strength of the cured product will be impaired; it is also not preferable if the component (B) is added in an amount of greater than 15 parts by mass per 100 parts by mass of the component (A), because the dielectric properties of the cured product and a storage stability of the composition will deteriorate.

Further, one kind of the epoxy resin as the component (B) may be used alone, or two or more kinds thereof may be used in combination.

(C) Diaminotriazine Ring-Containing Imidazole

A component (C) is a diaminotriazine ring-containing imidazole. This component is added as a catalyst for promoting a curing reaction of the heat-curable resin contents (components (A) and (B)). There are no particular restrictions on the component (C) as long as it is a diaminotriazine ring-containing imidazole.

Specific examples of the component (C) include 2,4-diamino-6-[2'-methylimidazolyl-(1')]-ethyl-s-triazine (2MZ-A by SHIKOKU CHEMICALS CORPORATION), 2,4-diamino-6-[2'-undecylimidazolyl-(1')]-ethyl-s-triazine (C11Z-A by SHIKOKU CHEMICALS CORPORATION), 2,4-diamino-6-[2'-ethyl-4' methylimidazolyl-(1')]-ethyl-s-triazine (2E4MZ-A by SHIKOKU CHEMICALS CORPORATION), and 2,4-diamino-6-[2'-methylimidazolyl-(1')]-ethyl-s-triazineisocyanuric acid adduct (2MA-OK by SHIKOKU CHEMICALS CORPORATION).

The component (C) is added in an amount of 0.1 to 5 parts by mass, preferably 0.5 to 3 parts by mass, per 100 parts by mass of the component (A). It is not preferable if the component (C) is added in an amount of smaller than 0.1 parts by mass per 100 parts by mass of the component (A), because curability will be impaired; it is also not preferable if the component (C) is added in an amount of greater than 5 parts by mass per 100 parts by mass of the component (A), because the dielectric properties of the cured product and the storage stability of the composition will deteriorate.

(D) Inorganic Filler

In addition to the components (A) to (C), an inorganic filler (D) may further be added to the adhesive composition for FPC of the present invention. The inorganic filler (D) may be added to improve a strength and rigidity of the cured product of the adhesive composition for FPC of the present invention, and/or adjust a thermal expansion coefficient as well as a dimensional stability of the cured product. As the inorganic filler, there can be used those that are normally added to epoxy resin compositions and silicone resin compositions. Examples of the inorganic filler (D) include silicas such as a spherical silica, a molten silica and a crystalline silica; alumina; silicon nitride; aluminum nitride; boron nitride; barium sulfate; talc; clay; aluminum hydroxide; magnesium hydroxide; calcium carbonate; glass fibers; and glass particles. Further, in order to improve dielectric properties, there may also be used a fluorine-containing resin, a coating filler and/or hollow particles; and for the purpose of, for example, imparting an electric conductivity, there may also be added an electrically conductive filler such as metal particles, metal-coated inorganic particles, carbon fibers and carbon nanotubes.

One kind of the inorganic filler may be used alone, or two or more kinds thereof may be used in combination.

There are no particular restrictions on the average particle size and shape of the inorganic filler; a spherical silica having an average particle size of 0.5 to 5 μm is particularly preferably used if molding a film or a substrate. Here, an average particle size is a value obtained as a mass average value $D_{50}$ (or median size) in a particle size distribution measurement carried out by a laser diffraction method.

Moreover, in order to improve properties, it is preferred that the inorganic filler be such an inorganic filler that has been surface-treated with a silane coupling agent having organic groups capable of reacting with maleimide groups.

Examples of such silane coupling agent include an epoxy group-containing alkoxysilane, an amino group-containing alkoxysilane, a (meth)acryl group-containing alkoxysilane and an alkenyl group-containing alkoxysilane.

As such silane coupling agent, a (meth)acryl group and/or amino group-containing alkoxysilane is preferably used, specific examples of which include 3-methacryloxypropyltrimethoxysilane, 3-acryloxypropyltrimethoxysilane, N-phenyl-3-aminopropyltrimethoxysilane, N-2-(aminoethyl)-3-aminopropyltrimethoxysilane and 3-aminopropyltrimethoxysilane.

Other Optional Components

Other than the above components, there may also be added, for example, a reactive functional group-containing organopolysiloxane, a nonfunctional silicone oil, an organic synthetic rubber, a photosensitizer, a light stabilizer, a polymerization inhibitor, a flame retardant, a colorant, a dye and an adhesion aid; and even an ion trapping agent for the purpose of improving electrical properties.

The adhesive composition for FPC of the present invention can be produced by mixing the components (A) to (C); the component (D) that is to be added if necessary; and other optional components.

The adhesive composition for FPC of the present invention may also be dissolved into an organic solvent so as to be treated as a varnish. By turning the composition into a varnish, film formation will be easier, and a glass cloth made of an E glass, low-dielectric glass, quartz glass or the like will be able to be coated and impregnated with the composition more easily. As for the organic solvent, any organic solvent may be used as long as it allows the heat-curable resin contents which are the components (A) and (B) to be dissolved therein.

Examples of such organic solvent include general organic solvents such as methylethylketone (MEK), cyclohexanone, ethyl acetate, tetrahydrofuran (THF), isopropanol (IPA), xylene, toluene and anisole. Any one of these organic solvents may be used alone, or two or more of them may be used in combination.

In terms of solubilities of the components (A) and (B), it is preferred that there be used organic solvents such as anisole, xylene and toluene. In contrast, in terms of having a high boiling point and toxicity, it is preferred that there be not used aprotic polar solvents such as dimethylsulfoxide (DMSO), dimethylformamide (DMF) and N-methylpyrrolidone (NMP).

This adhesive composition for FPC can be turned into an uncured resin sheet or an uncured resin film by applying the abovementioned varnish to a base material, and then volatilizing the organic solvent, and further turned into a cured resin sheet or a cured resin film by curing the same. Below is an example of a method for producing the sheet and film; the production method shall not be limited to the one described hereunder.

For example, after applying the adhesive composition for FPC (varnish) dissolved in the organic solvent to the base material, heating will be performed at a temperature of usually not lower than 80° C., preferably not lower than 100° C. for 0.5 to 5 hours so as to eliminate the organic solvent, followed by further performing heating at a temperature of not lower than 150° C., preferably not lower than 175° C. for another 0.5 to 10 hours so as to allow there to be formed a strong cured film with a flat surface.

The temperature in the drying step for eliminating the organic solvent and the temperature in the subsequent heating and curing step may each be constant; it is preferred that these temperatures be raised in a step-wise manner. In this way, the organic solvent can be efficiently eliminated from the composition, and the curing reaction of the resin can efficiently proceed as well.

There are no particular restrictions on a method for applying the varnish; there may be employed methods using, for example, a spin coater, a slit coater, a sprayer, a dip coater or a bar coater.

As the base material, there may be used those that are generally used, examples of which include polyolefin resins such as a polyethylene (PE) resin, a polypropylene (PP) resin and a polystyrene (PS) resin, and polyester resins such as a polyethylene terephthalate (PET), a polybutylene terephthalate (PBT) resin and a polycarbonate (PC) resin. These base materials may be such that the surfaces thereof have already been subjected to a mold release treatment.

Further, there are no particular restrictions on the thickness of a coating layer; a thickness after distilling away the solvent is in a range of 1 to 100 μm, preferably 3 to 80 μm. A cover film may further be provided on the coating layer.

Other than the above method, the components may be preliminarily mixed together, followed by using a melting and kneading machine to push out the mixture into the shape of a sheet or film so that such sheet or film can then be used as it is.

The cured film obtained by curing the adhesive composition for FPC of the present invention has an excellent heat resistance, excellent mechanical properties, excellent electrical properties, an excellent adhesiveness to the base material and an excellent solvent resistance as well as a low permittivity. Specifically, it is preferred that a cured product obtained after performing heating at 180° C. for two hours exhibit a dielectric tangent of not larger than 0.0040, more preferably not larger than 0.0035 when measured by an SPDR dielectric resonator at 10 GHz under a temperature of 25° C.

Thus, this cured film can be utilized as, for example, a film for use in a semiconductor device, specifically a passivation film or protective film provided on the surface of a semiconductor element; a junction protective film for use in junction areas of, for example, a diode and a transistor; and an α-ray shielding film, interlayer insulation film and ion implantation mask for a VLSI. Other than these purposes, the cured film may also be utilized as a conformal coating film for a printed circuit board, an oriented film for an LCD element, a protective film for glass fibers, and a surface protective film for a solar cell. Further, the adhesive composition for FPC of the present invention may be utilized for a wide range of purposes such as that of a paste composition, in a sense that, for example, if containing an inorganic filler(s), the composition can be used as a paste composition for printing; and if containing an electrically conductive filler(s), the composition may be used as an electrically conductive paste composition.

Further, since the composition of the present invention can be turned into the shape of a film or a sheet when in an uncured state, and has a favorable handling property, a self-adhesiveness as well as excellent dielectric properties, it can be preferably used in a bonding film for a flexible printed-wiring board (FPC).

Also, a glass cloth or the like made of an E glass, low-dielectric glass, quartz glass or the like may at first be impregnated with the adhesive composition for FPC that has been turned into a varnish, followed by eliminating the organic solvent, and then achieving a semi-cured state so as to allow the semi-cured product to be used as a prepreg. Further, an FPC substrate can be produced by laminating such prepreg and a copper foil or the like. It is preferable to use the adhesive composition for FPC of the present invention, because this composition also has an excellent adhesiveness to a copper foil, and the copper foil shall thus not be peeled off from the base material even if the FPC substrate is used in a manner where the FPC substrate is to be repeatedly bended.

Here, in the present invention, "semi-cured" refers to a state of B-stage (a curing intermediate of a heat-curable resin composition; a resin in such state will soften when heated and swell when in contact with a certain type of solvent, but will not be completely melted and dissolved).

WORKING EXAMPLES

The present invention is described in detail hereunder with reference to working and comparative examples; the present invention shall not be limited to the following working examples.

(A) Maleimide Compound Having at Least Two Maleimide Groups in One Molecule
    (A-1): Linear alkylene group-containing maleimide compound represented by the following formula "SLK-3000" (by Shin-Etsu Chemical Co., Ltd., Mn=7,200)

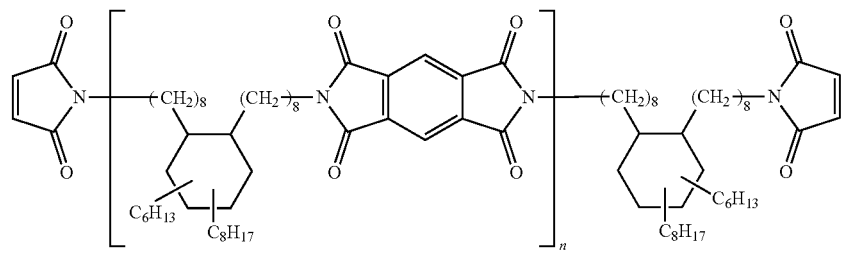

n ≈ 2.2 (Average value)

(A-2): Linear alkylene group-containing maleimide compound represented by the following formula "SLK-2600" (by Shin-Etsu Chemical Co., Ltd., Mn=5,000)

(A-5): Phenylmethane maleimide "BMI-2000" (by Daiwa Kasei Industry Co., Ltd., Mn=600, for use in comparative example)

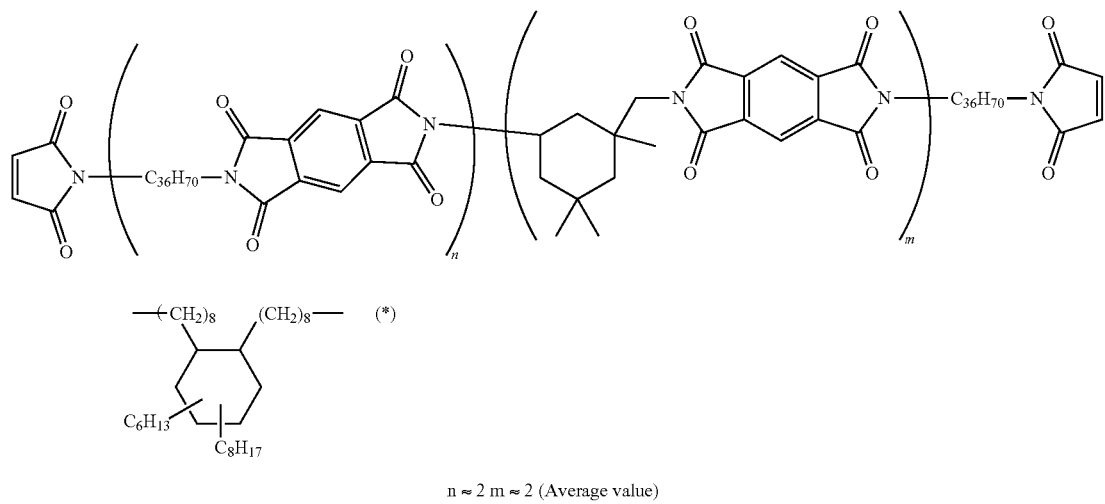

n ≈ 2 m ≈ 2 (Average value)

wherein —C$_{36}$H$_{70}$— represents a dimer acid skeleton, and this dimer acid skeleton contains therein the group represented by (*).

(A-3): Linear alkylene group-containing maleimide compound represented by the following formula "SLK-2500" (by Shin-Etsu Chemical Co., Ltd., Mn=4,200)

(B) Epoxy Resin (B-1): Glycidylamine type epoxy resin "jER-630" (by Mitsubishi Chemical Corporation)

(B-2): Biphenyl aralkyl type epoxy resin "NC-3000" (by Nippon Kayaku Co., Ltd.)

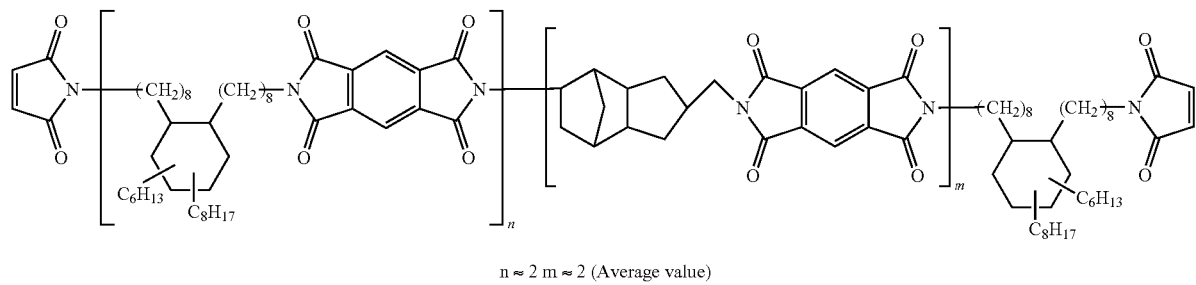

n ≈ 2 m ≈ 2 (Average value)

(A-4): Linear alkylene group-containing maleimide compound represented by the following formula "SLK-1500" (by Shin-Etsu Chemical Co., Ltd., Mn=2,400, for use in comparative example)

(B-3): Dicyclopentadiene type epoxy resin "HP-7200" (by DIC Corporation)

(B-4): Bisphenol A type epoxy resin "jER-828" (by Mitsubishi Chemical Corporation)

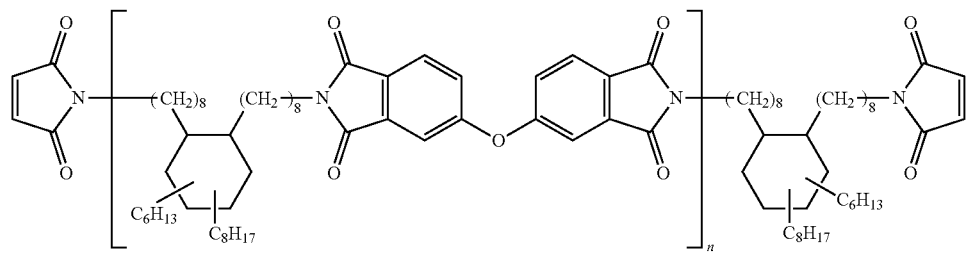

n ≈ 2 (Average value)

(B-5): Isocyanuric skeleton type epoxy resin "TEPIC-S" (by Nissan Chemical Corporation)
(B-6): Bisphenol F type epoxy resin "YDF-8170" (by NIPPON STEEL Chemical & Material CO., LTD.)
(C) Diaminotriazine Ring-Containing Imidazole
- (C-1): 2,4-diamino-6-[2'-methylimidazolyl-(1')]-ethyl-s-triazine "2MZ-A" (by SHIKOKU CHEMICALS CORPORATION))
- (C-2): 2,4-diamino-6-[2'-methylimidazolyl-(1')]-ethyl-s-triazineisocyanuric acid adduct "2MA-OK" (by SHIKOKU CHEMICALS CORPORATION)
- (C-3): 2-ethyl-4-methylimidazole "2E4MZ" (by SHIKOKU CHEMICALS CORPORATION, for use in comparative example)
- (C-4): Dicumylperoxide "PERCUMYL D" (by NOF CORPORATION, for use in comparative example)

(D) Inorganic Filler
- (D-1): Molten spherical silica "MUF-4" (by TATSUMORI LTD., average particle size 4 μm) treated with phenylamino group-modified silane coupling agent "KBM-573" (by Shin-Etsu Chemical Co., Ltd.)

(E) Adhesion Aid
- (E-1): 3-glycidoxypropyltrimethoxysilane "KBM-403" (by Shin-Etsu Chemical Co., Ltd.)

Working Examples 1 to 18; Comparative Examples 1 to 7

The components were dissolved and dispersed into anisole at the compounding ratios (parts by mass) shown in Tables 1 and 2, followed by making adjustments so that a non-volatile content would be 60% by mass, thus obtaining a varnish of the resin composition. A roller coater was then used to apply the varnish of the resin composition to a PET film having a thickness of 38 μm in a manner such that the composition applied thereto would have a thickness of 50 μm after drying. An uncured resin film was then obtained by performing drying at 80° C. for 15 min. The following evaluations were performed using the uncured resin film obtained. The results thereof are shown in Tables 1 and 2. Here, those marked "N.D" in the evaluation results shown in Table 2 indicate that evaluations were unable to be conducted as an evaluatable sample(s) were unable to be obtained due to a poor film-forming property.

Film-Forming Property

Whether cracks and/or breakages had occurred in the uncured resin film was visually observed after bending the uncured resin film at 90° under 25° C. "○" was given to examples exhibiting no cracks and no breakages at all; "x" was given to examples exhibiting even a slight degree of cracks or breakages.

Moisture Absorption Property

The uncured resin film was cured by performing heating at 180° C. for two hours. Later, a change in weight was measured after storing the cured resin film at 85° C., 85% RH for a week. "○" was given to examples where the weight of the resin film had changed by less than 1%; "x" was given to examples where the weight of the resin film had changed by 1% or more.

Storage Stability

A storage stability was evaluated based on a rise in viscosity after storing the uncured resin film. There was measured a melt viscosity after storing the uncured resin film in an incubator at 25° C. for a week; the melt viscosity measured was then compared to an initial value. "○" was given to examples where the viscosity had changed by less than 10%; "x" was given to examples where the viscosity had changed by 10% or more.

Dielectric Property

A cured resin film obtained by heating the uncured resin film at 180° C. for two hours was cut into test pieces each having a size of 60 mm×60 mm. An SPDR dielectric resonator (MS46122B by ANRITSU CORPORATION) was then used to measure a relative permittivity and dielectric tangent of the prepared test pieces at 10 GHz under 25° C.

90° Peeling Strength Test

An adhesion strength of the resin film to a copper foil was evaluated. The uncured resin film was cut into pieces of a size of 10 mm×76 mm, followed by using a vacuum laminator to attach a copper foil (thickness: 18 μm, Rz=0.6 μm) to a glass with such uncured resin film being interposed therebetween, and then performing heating at 180° C. for two hours so as to cure the uncured resin film, thereby obtaining a test specimen. Instead of a copper foil, an LCP film and an MPI film were individually used to produce test specimens by a similar operation as above.

The adhesion strength to the copper foil was measured in such a manner that a 90° peeling strength test was performed on the abovementioned test specimen at a measurement speed of 50 mm/min using an autograph (AG-IS by SHIMADZU CORPORATION).

An adhesion strength between the LCP or MPI film and the resin film was visually evaluated. "○" was given to examples where a high adhesion i.e. a sufficient adhesion strength was observed; Δ was given to examples where while adhesion was observed, the adhesion strength was insufficient; "x" was given to examples where adhesion was not observed.

Adhesiveness after Reflow

An adhesion strength of the resin film after reflow was evaluated. The uncured resin film was cut into pieces of a size of 10 mm×76 mm, followed by using a vacuum laminator to attach a copper foil (thickness: 18 μm, Rz=0.6 μm) to a glass with such uncured resin film being interposed therebetween, and then performing heating at 180° C. for two hours so as to cure the uncured resin film, thereby obtaining a test specimen.

The test specimen obtained was then passed through an IR reflow furnace of 260° C. (TNR15-225LH by TAMURA CORPORATION) three times.

The adhesion strength to the copper foil was measured in such a manner that a 90° peeling strength test was performed on the abovementioned test specimen at a measurement speed of 50 mm/min using an autograph (AG-IS by SHIMADZU CORPORATION).

"○" was given to examples where the adhesion strength was able to be maintained by 80% or more as compared to the adhesion strength before reflow; "x" was given to examples where the adhesion strength was maintained by less than 80% as compared to the adhesion strength before reflow.

TABLE 1

| | Composition table (part by mass) | | Number average molecular weight | Working example | | | | | | | | |
|---|---|---|---|---|---|---|---|---|---|---|---|---|
| | | | | 1 | 2 | 3 | 4 | 5 | 6 | 7 | 8 | 9 |
| A | Maleimide compound | SLK-3000 | 7200 | 100 | | | 50 | 50 | 50 | 50 | 50 | 50 |
| | | SLK-2600 | 5000 | | 100 | | 50 | 50 | 50 | 50 | 60 | 60 |
| | | SLK-2500 | 4200 | | | 100 | | | | | | |
| | | SLK-1500 | 2400 | | | | | | | | | |
| | | BMI-2000 | 600 | | | | | | | | | |
| B | Epoxy resin | jER-630 | | 5 | 5 | 5 | 5 | | | | | |
| | | NC-3000 | | | | | | 5 | | | | |
| | | HP-7200 | | | | | | | 5 | | | |
| | | jER-828 | | | | | | | | 5 | | |
| | | TEPIC-S | | | | | | | | | 5 | |
| | | YDF-8170 | | | | | | | | | | 5 |
| C | Curing catalyst | 2MZ-A | | 1 | 1 | 1 | 1 | 1 | 1 | 1 | 1 | 1 |
| | | 2MA-OK | | | | | | | | | | |
| | | 2EAMZ | | | | | | | | | | |
| | | DCPO | | | | | | | | | | |
| D | Inorganic filler | MUF-4 | | | | | | | | | | |
| E | Adhesion aid | KBM-403 | | | | | | | | | | |
| Evaluation | Film-forming property | | | ○ | ○ | ○ | ○ | ○ | ○ | ○ | ○ | ○ |
| | Moisture absorption property | | | ○ | ○ | ○ | ○ | ○ | ○ | ○ | ○ | ○ |
| | Storage stability | | | ○ | ○ | ○ | ○ | ○ | ○ | ○ | ○ | ○ |
| | Relative permittivity (10 GHz) | | | 2.5 | 2.5 | 2.5 | 2.5 | 2.5 | 2.5 | 2.5 | 2.5 | 2.5 |
| | Dielectric tangent (10 GHz) | | | 0.0032 | 0.0031 | 0.0030 | 0.0031 | 0.0027 | 0.0026 | 0.0031 | 0.0032 | 0.0031 |
| | 90° peeling strength test (Cu foil) | | kN/m | 1.5 | 1.0 | 1.1 | 1.1 | 1.1 | 1.0 | 1.0 | 1.1 | 1.0 |
| | 90° peeling strength test (MPI film) | | | ○ | ○ | ○ | ○ | ○ | ○ | ○ | ○ | ○ |
| | 90° peeling strength test (LCP film) | | | ○ | ○ | ○ | ○ | ○ | ○ | ○ | ○ | ○ |
| | Ahesiveness after reflow | | | ○ | ○ | ○ | ○ | ○ | ○ | ○ | ○ | ○ |

| | Composition table (part by mass) | | Number average molecular weight | Working example | | | | | | | | |
|---|---|---|---|---|---|---|---|---|---|---|---|---|
| | | | | 10 | 11 | 12 | 13 | 14 | 15 | 16 | 17 | 18 |
| A | Maleimide compound | SLK-3000 | 7200 | 50 | 50 | 50 | 50 | 50 | 50 | 50 | 50 | 100 |
| | | SLK-2600 | 5000 | 50 | 50 | 50 | 50 | 50 | 50 | 60 | 60 | |
| | | SLK-2500 | 4200 | | | | | | | | | |
| | | SLK-1500 | 2400 | | | | | | | | | |
| | | BMI-2000 | 600 | | | | | | | | | |
| B | Epoxy resin | jER-630 | | 0.5 | 12 | 5 | 5 | 2.5 | 2.5 | | 2.5 | 2.5 |
| | | NC-3000 | | | | | | 2.5 | | 5 | 2.5 | 2.5 |
| | | HP-7200 | | | | | | | 2.5 | | | |
| | | jER-828 | | | | | | | | | | |
| | | TEPIC-S | | | | | | | | | | |
| | | YDF-8170 | | | | | | | | | | |
| C | Curing catalyst | 2MZ-A | | 1 | 1 | 0.5 | 4 | 1 | 1 | | 1 | 1 |
| | | 2MA-OK | | | | | | | | 1 | | |
| | | 2EAMZ | | | | | | | | | | |
| | | DCPO | | | | | | | | | | |
| D | Inorganic filler | MUF-4 | | | | | | | | | | 150 |
| E | Adhesion aid | KBM-403 | | | | | | | | | 1 | 1 |
| Evaluation | Film-forming property | | | ○ | ○ | ○ | ○ | ○ | ○ | ○ | ○ | ○ |
| | Moisture absorption property | | | ○ | ○ | ○ | ○ | ○ | ○ | ○ | ○ | ○ |
| | Storage stability | | | ○ | ○ | ○ | ○ | ○ | ○ | ○ | ○ | ○ |
| | Relative permittivity (10 GHz) | | | 2.5 | 2.5 | 2.5 | 2.5 | 2.5 | 2.5 | 2.5 | 2.5 | 3.0 |
| | Dielectric tangent (10 GHz) | | | 0.0028 | 0.0038 | 0.0032 | 0.0030 | 0.0028 | 0.0026 | 0.0035 | 0.0031 | 0.0018 |
| | 90° peeling strength test (Cu foil) | | kN/m | 0.9 | 1.3 | 1.1 | 0.9 | 1.1 | 1.2 | 0.8 | 1.2 | 1.4 |

TABLE 1-continued

| | | | | | | | | | |
|---|---|---|---|---|---|---|---|---|---|
| 90° peeling strength test (MPI film) | ○ | ○ | ○ | ○ | ○ | ○ | ○ | ○ | ○ |
| 90° peeling strength test (LCP film) | ○ | ○ | ○ | ○ | ○ | ○ | ○ | ○ | ○ |
| Ahesiveness after reflow | ○ | ○ | ○ | ○ | ○ | ○ | ○ | ○ | ○ |

TABLE 2

| Composition table (parts by mass) | | | Number average molecular weight | Comparative example | | | | | | |
|---|---|---|---|---|---|---|---|---|---|---|
| | | | | 1 | 2 | 3 | 4 | 5 | 6 | 7 |
| A | Maleimide compound | SLK-3000 | 7200 | 50 | 50 | 50 | 50 | 50 | | |
| | | SLK-2600 | 5000 | 50 | 50 | 50 | 50 | 50 | | |
| | | SLK-2500 | 4200 | | | | | | | |
| | | SLK-1500 | 2400 | | | | | | 100 | |
| | | BMI-2000 | 600 | | | | | | | 100 |
| B | Epoxy resin | jER-630 | | 2.5 | | 2 | 8 | 2 | 2 | 2 |
| | | NC-3000 | | 2.5 | | 2 | 8 | 2 | 2 | 2 |
| | | HP-7200 | | | | | | | | |
| | | jER-828 | | | | | | | | |
| | | TEPIC-S | | | | | | | | |
| | | YDF-8170 | | | | | | | | |
| C | Curing catalyst | 2MZ-A | | | 1 | | 1 | 5 | 1 | 1 |
| | | 2MA-OK | | 1 | | | | | | |
| | | 2EAMZ | | | | | | | | |
| | | DCPO | | | | 1 | | | | |
| D | Inorganic filler | MUF-4 | | | | | | | | |
| E | Adhesion aid | KBM-403 | | 1 | 1 | 1 | 1 | | 1 | 1 |
| Evaluation | Film-forming property | | | ○ | x | ○ | ○ | ○ | x | x |
| | Moisture absorption property | | | ○ | ○ | ○ | x | x | ○ | x |
| | Storage stability | | | x | ○ | ○ | x | ○ | ○ | ○ |
| | Relative permittivity (10 GHz) | | | 2.5 | N.D. | 2.5 | 2.5 | 2.5 | N.D. | N.D. |
| | Dielectric tangent (10 GHz) | | | 0.0029 | N.D. | 0.0030 | 0.0080 | 0.0060 | N.D. | N.D. |
| | 90° peeling strength test (Cu foil) | | kN/m | 0.5 | N.D. | 0.4 | 1.3 | 1.2 | N.D. | N.D. |
| | 90° peeling strength test (MPI film) | | | Δ | x | x | ○ | ○ | x | x |
| | 90° peeling strength test (LCP film) | | | Δ | x | x | ○ | ○ | x | x |
| | Ahesiveness after reflow | | | x | x | x | ○ | ○ | x | ○ |

Based on these results, the usefulness of the adhesive composition for FPC of the present invention was confirmed.

The invention claimed is:

1. An adhesive composition for a flexible printed-wiring board (FPC: Flexible Printed Circuits), comprising:
   (A) 100 parts by mass of a maleimide compound having at least two maleimide groups in one molecule, having a number average molecular weight of greater than 4,000, and having at least one divalent organic group selected from a dimer acid skeleton, a linear alkylene group having not less than 6 carbon atoms, and a linear alkenylene group having not less than 6 carbon atoms, the maleimide compound being represented by the following general formula (1),

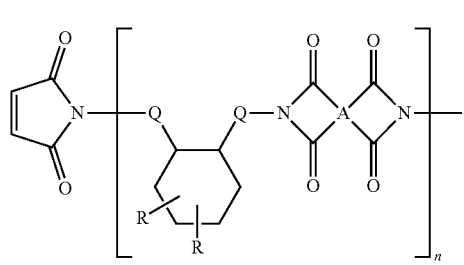

(1)

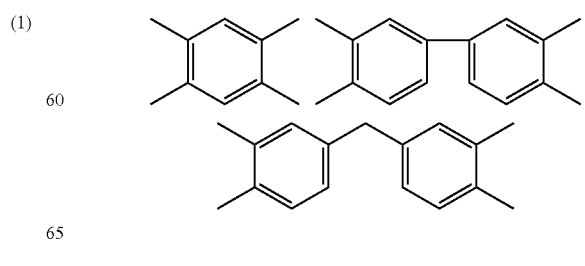

wherein A independently represents a tetravalent organic group having an aromatic ring or aliphatic ring represented by any one of the following structures:

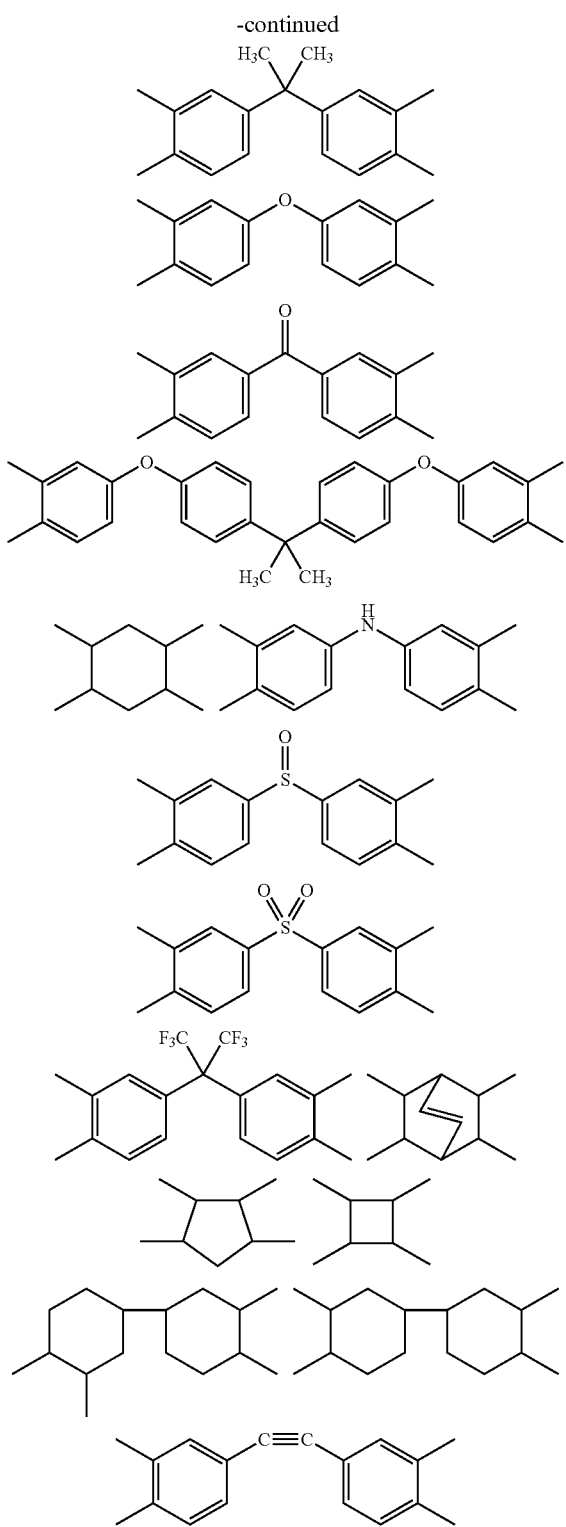
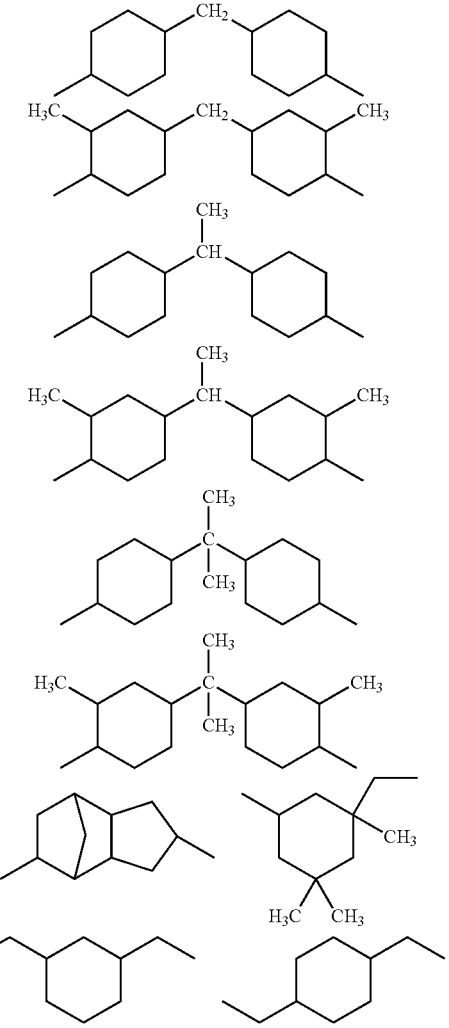

wherein bonds in the above structural formulae that are yet unbonded to substituent groups are to be bonded to carbonyl carbons forming maleimide structures in the formula (1), B represents an alkylene group that has 6 to 18 carbon atoms and an aliphatic ring represented by any one of the following structures:

wherein bonds in the above structural formulae that are yet unbonded to substituent groups are to be bonded to nitrogen atoms forming maleimide structures in the formula (1), Q independently represents a linear alkylene or linear alkenylene group having 6 to 20 carbon atoms, R independently represents a linear or branched alkyl group having 6 to 12 carbon atoms, n represents a number of 2 to 70, m represents a number greater than 0 to 70;

(B) 0.1 to 15 parts by mass of an epoxy resin having at least two epoxy groups in one molecule; and (C) 0.1 to 5 parts by mass of a diaminotriazine ring-containing imidazole.

2. The adhesive composition for FPC according to claim 1, further comprising:

(D) an inorganic filler.

3. The adhesive composition for FPC according to claim 2, wherein the inorganic filler is such an inorganic filler that has been treated with a silane coupling agent having organic groups capable of reacting with the component (A).

4. A cured film obtained by heating the adhesive composition for FPC according to claim 1, wherein if the composition is heated at 180° C. for two hours, a dielectric tangent measured at 10 GHz under 25° C. is not larger than 0.0040.

5. A heat-curable resin film comprising the adhesive composition for FPC according to claim 1.

6. A prepreg comprising a semi-cured product of the adhesive composition for FPC according to claim 1.

7. An FPC substrate comprising a cured product of the adhesive composition for FPC according to claim 1.

8. The adhesive composition for FPC according to claim 1, wherein a total content of components (A), (B), and (C) is 41 to 100% by mass to a total mass of the composition.

9. The adhesive composition for FPC according to claim 1, wherein a content of component (A) is 39 to 99% by mass to a total mass of the composition.

10. A cured film obtained by heating the adhesive composition for FPC according to claim 1, wherein the cured film has a dielectric tangent measured at 10 GHz under 25° C. is not larger than 0.0040.

11. The adhesive composition for FPC according to claim 1, wherein the epoxy resin (B) comprises at least one epoxy resin selected from a bisphenol A type epoxy resin, a bisphenol F type epoxy resin, a biphenyl aralkyl type epoxy resin, a glycidylamine type epoxy resin, a dicyclopentadiene type epoxy resin, and an isocyanuric skeleton type epoxy resin.

12. The adhesive composition for FPC according to claim 1, wherein the diaminotriazine ring-containing imidazole (C) comprises at least one compound selected from 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4' methylimidazolyl-(1')]-ethyl-s-triazine, and 2,4-diamino-6-[2'-methylimidazolyl-(1')]-ethyl-s-triazineisocyanuric acid adduct.

13. The adhesive composition for FPC according to claim 1, wherein the maleimide compound (A) is a member selected from the group consisting of:

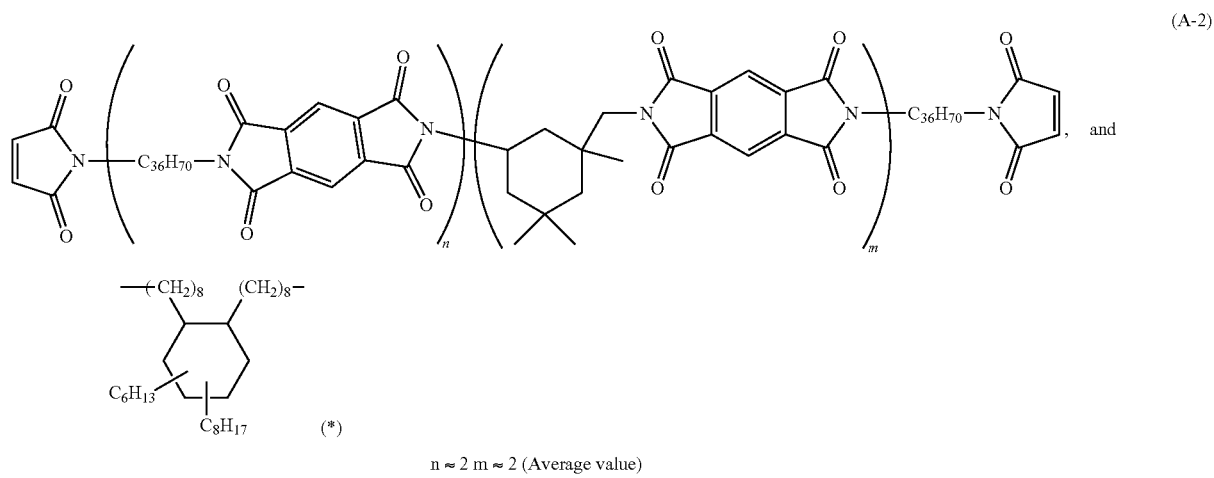

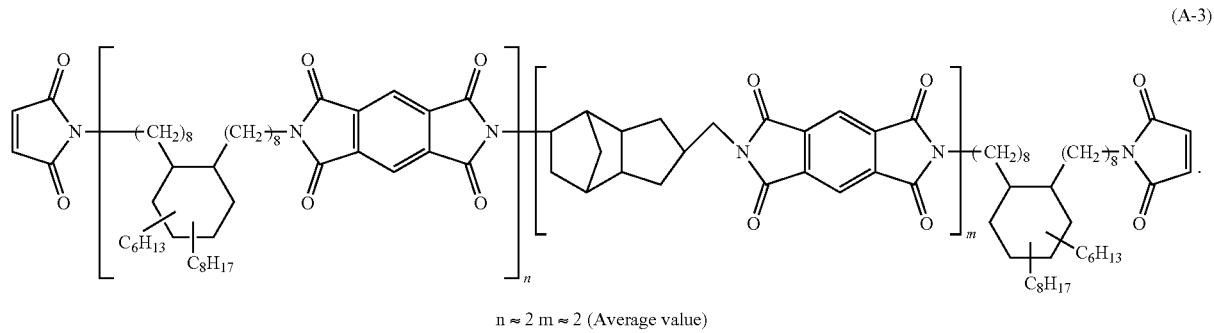

14. The adhesive composition for FPC according to claim 13, wherein the maleimide compound (A) is at least two members selected from the maleimide compounds A represented by the formulas (A-2) and (A-3).

* * * * *